(12) United States Patent
Vishnipolsky et al.

(10) Patent No.: US 7,164,142 B2
(45) Date of Patent: Jan. 16, 2007

(54) ELECTRICAL FEED-THROUGH STRUCTURE AND METHOD

(75) Inventors: Jimmy Vishnipolsky, Petach Tikva (IL); Efim Vinnitsky, Ashkelon (IL); Eliyahu Almog, Hasharon (IL)

(73) Assignee: Applied Materials, Inc., Santa Clara, CA (US)

( * ) Notice: Subject to any disclaimer, the term of this patent is extended or adjusted under 35 U.S.C. 154(b) by 1105 days.

(21) Appl. No.: 10/072,607

(22) Filed: Feb. 8, 2002

(65) Prior Publication Data

US 2003/0150630 A1 Aug. 14, 2003

(51) Int. Cl.
*H01J 37/30* (2006.01)
*H01B 7/00* (2006.01)
(52) U.S. Cl. ............... 250/492.2; 174/151; 174/8; 174/17 SF; 174/50.56
(58) Field of Classification Search ............. None
See application file for complete search history.

(56) References Cited

U.S. PATENT DOCUMENTS

| 4,647,133 | A  | * | 3/1987  | Renken et al. ............. 439/426 |
| 6,787,780 | B1 | * | 9/2004  | Hamaguchi et al. ...... 250/492.2 |
| 6,806,557 | B1 | * | 10/2004 | Ding ........................ 257/659 |

* cited by examiner

*Primary Examiner*—Jack I. Berman
(74) *Attorney, Agent, or Firm*—Tarek N. Fahmi

(57) ABSTRACT

Electrical lead-through systems from atmospheric into vacuum environments are presented. Electrical feed-through structures (EFTS) comprised of a multiplicity of parallel connection lines used to operate e-beam tip-array sources in high vac environments for chip lithography are disclosed. In one embodiment, an EFTS comprises a sheet of insulating material having conductive tracks extending along potions of the sheet and a vacuum seal separating one portion from another portion of the sheet so as to maintain a pressure differential among multiple portions of the sheet.

17 Claims, 2 Drawing Sheets

ELECTRICAL FEED-THROUGH STRUCTURE AND METHOD

FIELD OF THE INVENTION

The present invention relates to electrical feed-throughs into vacuum environments. In particular, although not exclusively, the present invention relates to lead-throughs providing large numbers of parallel connection lines, and the use of such feed-throughs to operate e-beam tip-array sources in highvac environments for chip lithography.

BACKGROUND TO THE INVENTION

The provision of electrical lead-throughs from atmospheric environments into a vacuum system has associated with it numerous difficulties, such as: the formation of a high quality seal; the requirement for very low out gassing from the materials used in the lead-through structure; and the need to have a lead-through structure which can withstand the forces resulting from the high differential pressure between a high vacuum environment and an atmospheric environment, or equally between a high vacuum and an ultra-high vacuum region. The conventional way of attempting to overcome these problems has been to use feed-throughs comprising metallic pins or tracks extending through a body of ceramic material. Such technology has enabled the interfacing of a moderate amount of separate connections from atmospheric into vacuum environments. However, a disadvantage of this technique is that it provides a limited signal density (i.e. there is a limit to the minimum spacing of the conductive pins through the ceramic). This conventional technology has, typically, not been able to provide a lead through structure with more than 500 parallel connections.

SUMMARY OF THE INVENTION

Embodiments of the present invention therefore aim to solve, at least partially, the above-mentioned problems associated with conventional lead-through structures. In particular, preferred embodiments of the present invention aim to provide a lead-through structure providing a very large number of parallel conductive tracks into a vacuum environment, that number being in excess of 1,000.

A first aspect of the present invention provides an electrical feed-through structure which comprises a sheet of insulating material, the sheet including at least one embedded layer of conductive tracks, the tracks extending from a first portion of the sheet to a second portion; and a vacuum seal made to the sheet so as to separate the first and second portions and permit evacuation of a first volume in contact with the first portion, whilst a second volume in contact with the second portion of the sheet is maintained at higher pressure.

Thus, the conductive tracks can provide a large number of parallel connection lines into the vacuum environment. The sheet structure of the electrical feed-through element facilitates the formation of a high quality vacuum seal to it.

Although the sheet may include just one embedded layer of conductive tracks, preferably there are 2 or more layers. By increasing the number of layers of embedded conductive tracks the number of "signal lines" into the vacuum environment can be increased. In principle, there is no real limit to the number of layers which may be employed, although in practice 2 to 8 layers may be sufficient.

Preferably, each embedded layer of conductive tracks has at least 100 conductive tracks in it, providing a 100 separate signal lines into the vacuum environment.

A wide variety of insulating materials may be used in the sheet to electrically separate the conductive tracks, and these materials include the following: silicon; printed-circuit-board (PCB) material; and glass.

The sheet may be a flexible structure, or alternatively may be substantially rigid.

Furthermore, it will be apparent from the specification that the term "sheet" may also be referred to equivalently as a "substrate", "wafer", or other similar form.

Preferably, the sheet may be a sheet formed by depositing alternate layers of insulating and conductive material on to a substrate. At the end of this process, the substrate may or may not be removed.

Multi-layer spreader boards (interconnect structures) for flip-chip are known. Such boards include a plurality of closely spaces contacts or contacting to the input/output terminals of the flip-ship. Conductive tracks from these connections extend through the spreader boards to further contact terminals "typically spaced radially away from the position of the flip-chip contacts". These further contacts being more widely spaced to facilitate electrical connections to external components and devices.

In certain preferred embodiments, the sheet is a circular wafer, and the first portion of the sheet is a circular or annular portion centred on the wafer.

The sheet may have a central aperture, over which a component to be connected to the conductive tracks in the first portion may be positioned.

Preferably, the sheet comprises via holes in the first and second portions, those via holes extending from a surface of the sheet to respective embedded tracks to permit connections to be made to the tracks. In use, the via holes will typically be filled with conductive materials such as solder, to permit electrical connection to the tracks to be made at the surface of the sheet.

Preferably, the vacuum seal is annular, with the first portion of the sheet being inside the annular seal, and the second portion being outside the annular seal.

Preferably, the vacuum seal may comprise a first generally annular clamping member in contact with a surface of the sheet. The term "in contact" is used in a sense so as to include the possibility of some sealing compound (such as vacuum grease) being used to improve the quality of the vacuum seal between the annular clamping member and the sheet surface.

Preferably, the vacuum seal includes a second generally annular clamping member in contact with an opposite surface of the sheet, the first and second generally annular members being arranged in register (i.e. generally concentrically, to clamp an annular portion of the sheet between them).

A second aspect of the present invention provides lithography apparatus which includes an e-beam source in the form of an array of tips, the e-beam source being operated in a highvac environment, and the tips being separately addressable (and therefore operable as e-beam emitters) from outside the highvac environment by means of one of the inventive electrical feed-through structures as described in the present specification.

A third aspect of the present invention is the use of a multi-layer interconnect structure as an electrical feed-through into a vacuum environment, the multi-layer interconnect structure comprising a sheet of insulated material, the sheet including at least one embedded layer of conductive tracks, where the tracks extend from a first portion of the sheet to a second portion.

A fourth aspect of the present invention provides a method of operating an electrical device in a vacuum environment, the device having a plurality of terminals and the method comprising the steps of: providing an interconnect structure including a sheet of insulating material, the sheet having at least one embedded layer of conductive tracks, the tracks extending from a first portion of the sheet to a second portion; positioning the electrical device generally over the first portion of the sheet; forming electrical connections between the terminals and tracks in the first portion; forming a vacuum seal to the sheet to include the device inside the seal and to separate the first portion from the second portion; forming a plurality of external connections to the tracks in the second portion of the sheet, evacuating a volume inside the vacuum seal, this volume including the device, and operating the device via the external connections.

BRIEF DESCRIPTION OF THE DRAWINGS

Preferred embodiments of the present invention will be described in the following section with reference to the accompanying drawings, of which.

DESCRIPTION OF PREFERRED EMBODIMENTS

Figure 1:
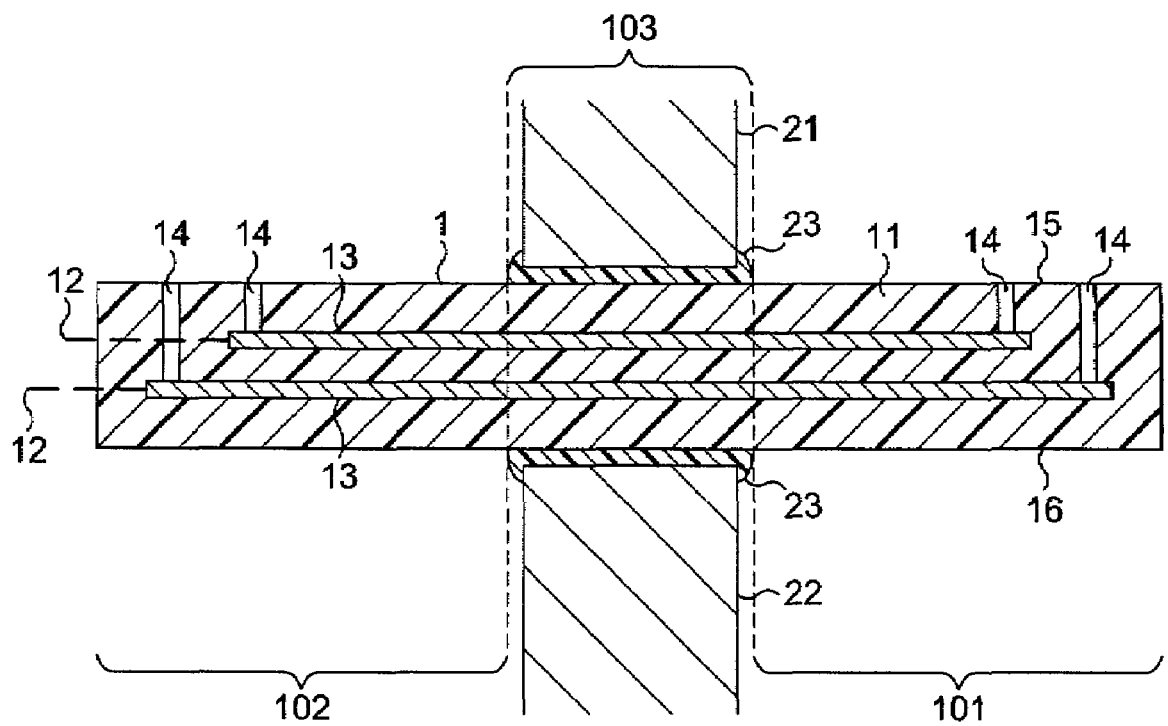
FIG. 1 is a schematic cross section of an electrical feed-through structure embodying the present invention.

Referring now to FIG. 1, in a first embodiment the electrical feed-through structure comprises a rigid, flat, rectangular sheet 1 which includes two embedded layers 12 of conductive tracks 13. The conductive tracks 13 extend from a first portion 101 of the sheet to a second portion 102. The layers 12 and the conductive tracks 13 within each layer are electrically isolated from each other by means of insulating material 11. The upper surface 15 and lower surface 16 of the sheet 1 are both generally flat.

The conductive tracks 13 extend through a central portion 103 of the sheet. An upper sealing member 21 is positioned above the surface 15 of the central portion 103, and similarly a lower sealing member 22 is positioned below the surface 16 of the central portion 103. A fillet of sealing material 23 forms a vacuum seal between the upper and lower sealing members and the sheet 1. This enables the volume surrounding the first portion 101 to be evacuated, whilst maintaining a volume around the second portion 102 at higher pressure. The conductive tracks 13 therefore provide separate electrical lines from one side of the vacuum seal to the other. Via holes 14 which extend from the upper surface 15 of the sheet down to the embedded tracks 13 are provided. In use, these via holes 14 are filled with conductive material, such as solder, and enable external connections to be made to the tracks 13.

Figure 2:
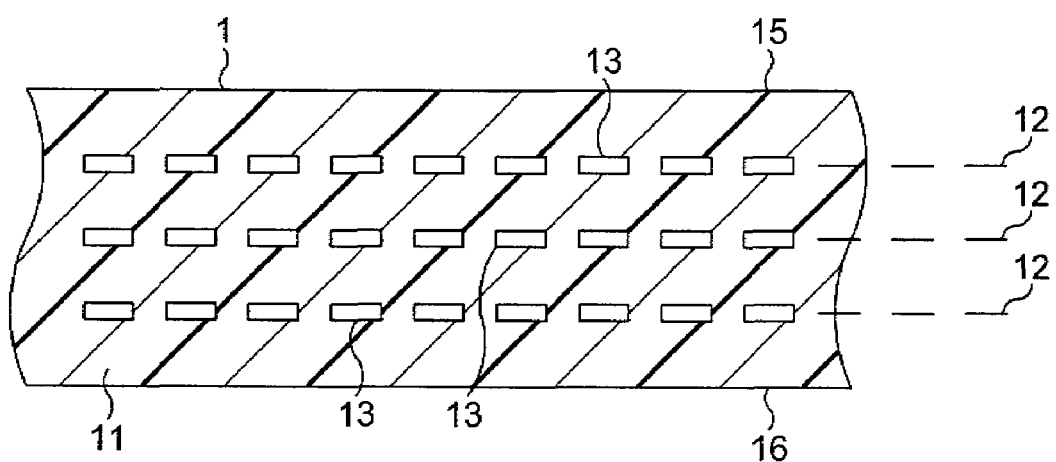
FIG. 2 is a schematic cross section of part of an interconnect sheet suitable for use in embodiments of the present invention.

Turning now to FIG. 2, this shows a schematic cross section of an interconnect sheet suitable for use in embodiments of the invention. The sheet 1 includes a body 11 of insulating material, and three layers 12 of conducting tracks 13, each layer including a large number of parallel tracks. External connections to the tracks are made by means of appropriately positioned via holes (not shown in the Figure). In this example, the structure has been built up by depositing alternate layers of insulating material 11 and conductive material.

Figure 3:
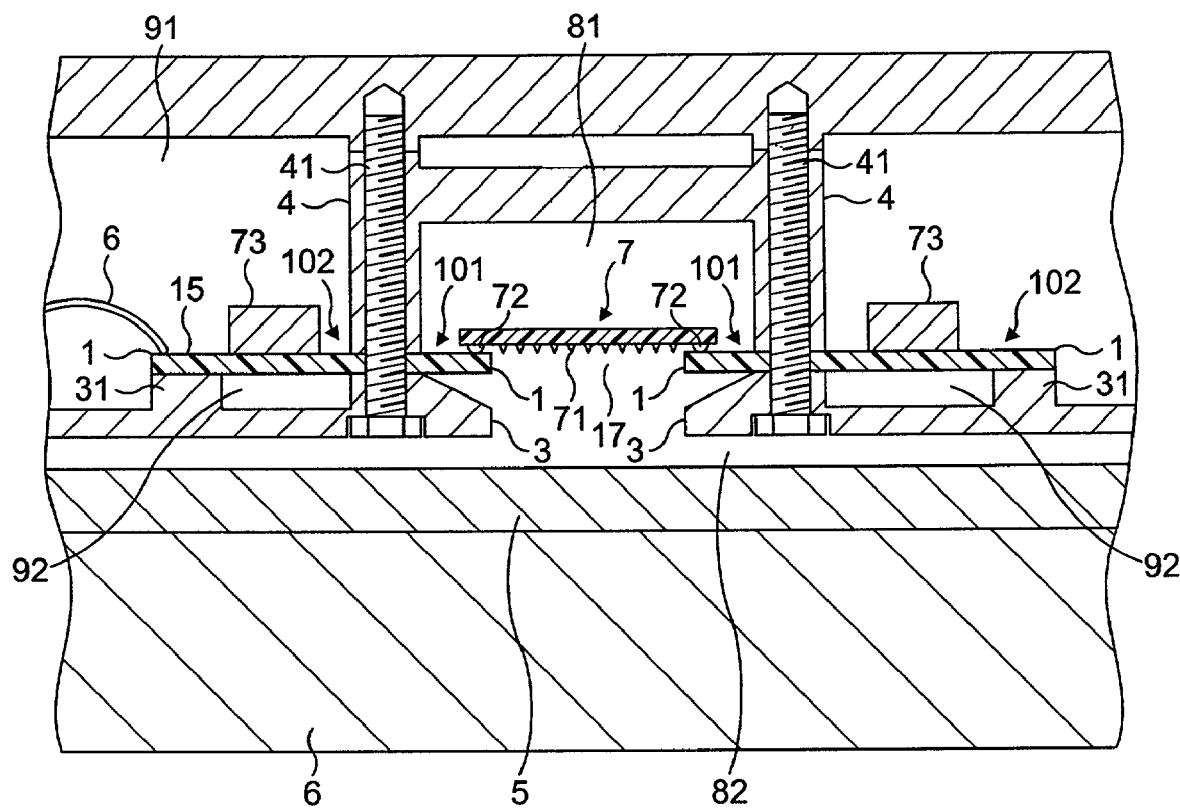
FIG. 3 is a schematic cross section of part of a lithography apparatus embodying the present invention.

Turning now to FIG. 3, this shows a schematic cross section of part of lithography apparatus embodying the present invention. The apparatus includes a field-emission e-beam source 7 which has an array of emission tips 71 located on its lower surface. These tips 71 are individually addressable, and when a tip is selected it emits an e-beam towards a target substrate 5. The target substrate 5 may have an e-beam-sensitive resist layer formed on its upper surface. The resist layer is patterned by appropriate control of the voltages applied to the tips 71 as the e-beam source 7 is scanned over the surface of the wafer 5. Although the Figure shows only a small number of tips 71 for clarity, but in reality the source 7 has a two dimensional array of tips 71, there being typically 5,000 separate tips in this array. The e-beam source 7 must be operated in a high vacuum environment. Furthermore, in order to be able to selectively control emission from each tip 71 a separate electrical connection (line) must be provided to each tip in the highvac environment from control circuitry located outside (the control circuitry is located in a low vacuum or even atmospheric environment so that generated heat may be dissipated). Thus, for a two dimensional tip array having 5,000 tips 71, 5,000 separate lines must be provided by the vacuum feed-through structure. In the illustrated embodiment, this is achieved by using an interconnect structure in the form of a sheet 1 of insulating material which includes 8 layers of conductive tracks, each layer including over 625 separate parallel tracks. These tracks extend from a first portion 101 of the sheet radially outwards to a second portion 102. In this example, the sheet takes the form of a circular wafer, having an aperture 17 in its centre, over which the e-beam source 7 is positioned. The sheet 1 is clamped between an upper sealing member 4 and a lower sealing member 3. Each sealing member has a generally annular sealing surface which is clamped in contact with a surface of the sheet 1 by means of bolts 41. The annular sealing surface of the lower clamping member 3 is aligned directly below the annular sealing surface of the upper clamping member 4. Thus, an annular portion of the sheet 1 is clamped between the members 3 and 4 sufficiently tightly to provide a vacuum seal separating the inner, first portion 101 of the sheet from the outer, second portion 102.

Electrical connections from the e-beam source 72 and the conductive tracks in the sheet 1 is by means of terminals 72 on the source 7 and solder-filled via holes (not shown) extending down to the embedded tracks.

Electronic components 73 forming control circuitry for the tip array are connected to embedded tracks in the outer, second portion 102 of the sheet 1. Further external connections 6 are provided.

In use, the volumes 81 and 82 are at high vacuum, and the volumes 91 and 92 are at atmosphere.

The target wafer 5 is supported by wafer support structure 6.

Thus, the array of tips 71 represents an array of multiple electrical targets located in a vacuum chamber. The apparatus provides a large amount of parallel data lines to those targets. It allows individual addressing of targets in the form of field emission e-beam sources using a large number of signals. These signals are generated by electronic circuitry located in an atmospheric environment, and are transmitted into an ultra high vacuum (UHV) environment, where the e-beam sources are located.

It will be apparent that an underlying idea of embodiments of the invention is to lead-through a large number of parallel connection lines on a sheet (substrate, wafer) comprising material such as silicon, glass or PCB material, while one part of the substrate is located in atmospheric environments and the other side, is located in vacuum or even ultra high vacuum environment.

In certain preferred embodiments the substrate may be a silicon wafer containing two 8 metal interconnect layers. The substrate may be located across a seal between atmospheric and ultra high vacuum environments. The seal thus separates the substrate into three functional zones: a first zone at atmospheric pressure, where heat can be dissipated; a sealing zone where a permanent or demountable seal is used to separate the atmospheric and UHV environments; and a high vacuum or UHV zone which is the final destination for data/control signals on the interconnect tracks.

In certain preferred embodiments, such as that shown in FIG. 3, the substrate at the atmospheric environment side 102 may carry thermal dissipation components, to allow these components to be located near to the final destination of their control signals, but outside the UHV environment so that heat can still be dissipated.

The substrate in the UHV environment (i.e. the first portion 101 of the substrate) carries the destination device/electronics which receives data/control signals from the outside control electronics by means of thousands of embedded connections.

Looking again at FIG. 3, the portion 101 of the sheet 1 inside the annular seal is surrounded by ultra high vacuum above and below (i.e. regions 81 and 82 are both at UHV) to prevent deflection of the sheet caused by differential pressures. Thus, the position of the array of tips 71 relative to the target substrate 5 can be controlled with high accuracy. At the atmospheric side, an annular support structure 31 forming part of the lower clamping member 3 supports an outer edge of the circular sheet 1. The volumes 91 and 92 which are respectively above and below the sheet 1 are each maintained at atmospheric pressure to again eliminate the problem of potential deflection of the sheet 1 under differential pressure.

The pair of sealing surfaces (i.e. the annular sealing surfaces on the upper and lower clamping members 4 and 3) have relatively small dimensions to eliminate the influence of lower clamping member 3 deflections on the e-beam source item 7 position.

Figure 4:
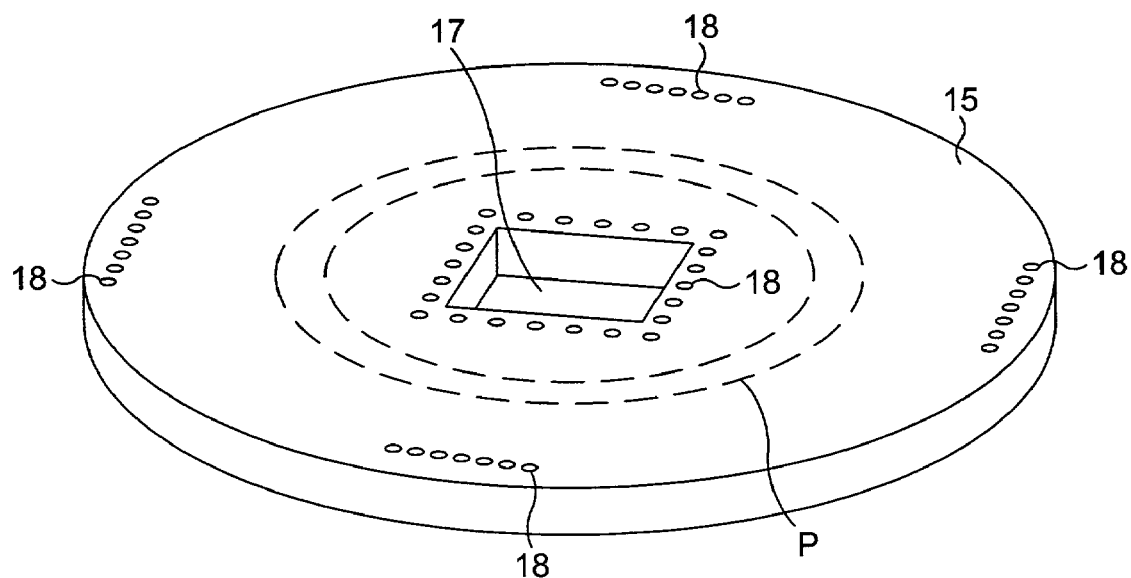
FIG. 4 is a schematic perspective view of an interconnect wafer suitable for use in embodiments of the present invention.

Turning now to FIG. 4, this shows in highly schematic form the interconnect wafer 1 using the embodiment of FIG. 3. The aperture 17 in the centre of the wafer is generally rectangular, and a plurality of solder filled via holes 18 provides connection down to the embedded tracks. The broken lines P show the general position of the annular seal formed by the clamping members 4 and 3 of the wafer 1. The embedded tracks extend from the central via holes radially outwards, through the sealing zone, to the outer annular portion of the wafer. Further solder filled via holes 18 in the outer portion of the wafer 1 enable external connections to be made, via the embedded tracks, to the destination device connected to the wafer inside the seal P.

The invention claimed is:

1. An electrical feed-through structure (EFTS) comprising:
   a sheet of insulating material, the sheet including at least one embedded layer of conductive tracks, the conductive tracks extending from a first portion of the sheet to a second portion; and
   a vacuum seal made to the sheet so as to separate the first and second portions and permit evacuation of a first volume in contact with said first portion whilst a second volume, in contact with said second portion, is maintained at higher pressure.

2. An EFTS in accordance with claim 1, wherein said sheet includes at least two embedded layers of conductive tracks.

3. An EFTS in accordance with claim 2, wherein the or each embedded layer comprises at least 100 conductive tracks.

4. An EFTS in accordance with claim 2, wherein said sheet comprises insulating material selected from the following list: silicon; printed-circuit-board material; glass.

5. An EFTS in accordance with claim 2, wherein said sheet is substantially rigid.

6. An EFTS in accordance with claim 2, wherein said sheet is a sheet formed by depositing alternate layers of insulating and conductive material onto a substrate.

7. An EFTS in accordance with claim 2, wherein said sheet is a flip-chip spreader board.

8. An EFTS in accordance with claim 2, wherein said sheet is a circular wafer, and said first portion is a circular or annular portion centered on the wafer.

9. An EFTS in accordance with claim 8, wherein said sheet has a central aperture.

10. An EFTS in accordance with claim 9, wherein the sheet comprises via holes in the first and second portions, extending from a surface at the sheet to respective embedded tracks to permit connections to be made to the tracks.

11. An EFTS in accordance with claim 9, wherein said vacuum seal is annular, the first portion of the sheet being inside the annular seal, and the second portion being outside.

12. An EFTS in accordance with claim 11, wherein said vacuum seal comprises a first generally annular clamping member in contact with a first surface of the sheet.

13. An EFTS in accordance with claim 12, wherein said vacuum seal comprises a second generally annular clamping member in contact with a second surface of the sheet, said second surface being opposite the first, and said first and second generally annular members being arranged in register to clamp an annular portion of said sheet between them.

14. An EFTS in accordance with claim 13, wherein the vacuum seal comprises a sealing compound.

15. Lithography apparatus comprising:
   an e-beam source comprising an array of tips, and having a plurality of control terminals to enable selective control of emission from said tips the source being positioned in an evacuable volume; and
   an electrical feed-through structure in accordance with any preceding claim, arranged such that said second portion is inside the evacuable volume, and said first portion is outside the evacuable volume,
   wherein said control terminals are connected to said tracks in the first portion, the apparatus further comprising e-beam source control electronics arranged outside said evacuable volume, and connected to said tracks in the second portion.

16. A method of operating an electrical device in a vacuum environment, the device having a plurality of terminals and the method comprising the steps of:

providing an interconnect structure comprising a sheet of insulating material, the sheet including at least one embedded layer of conductive tracks, the tracks extending from a first portion of the sheet to a second portion;

positioning the electrical device generally over the first portion of the sheet;

forming electrical connections between said terminals and said tracks in the first portion;

forming a vacuum seal to the sheet to include the device inside the seal and to separate the first portion from the second portion;

forming a plurality of external connections to the tracks in the second portion of the sheet;

evacuating a volume inside the vacuum seal, said volume including said device; and operating said device via said external connections.

17. A method in accordance with claim 16, wherein said vacuum seal is annular.

* * * * *